United States Patent
Darrer et al.

(10) Patent No.: US 7,528,672 B2
(45) Date of Patent: May 5, 2009

(54) OSCILLATOR ARRANGEMENT HAVING INCREASED EMI ROBUSTNESS

(75) Inventors: Franz Darrer, Graz (AT); Jürgen Fehle, Graz (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/952,491

(22) Filed: Sep. 28, 2004

(65) Prior Publication Data

US 2006/0055480 A1    Mar. 16, 2006

(30) Foreign Application Priority Data

Sep. 29, 2003   (DE)   ................. 103 45 234

(51) Int. Cl.
*H03B 5/36*    (2006.01)
(52) U.S. Cl. .................. 331/158; 331/116 FE; 331/183
(58) Field of Classification Search ............. 331/107 A, 331/116 R, 116 FE, 158, 183
See application file for complete search history.

(56) References Cited

U.S. PATENT DOCUMENTS 3,824,491 A * 7/1974 Treadway ............... 331/116 R
4,208,639 A    6/1980 Stickel
4,518,933 A    5/1985 Kröner
5,347,237 A    9/1994 Rokos
5,999,062 A * 12/1999 Gilbert ................... 331/116 R
6,577,204 B2 *  6/2003 Midtgaard ................... 331/158
6,624,708 B1 *  9/2003 Wessendorf ................ 331/158
6,956,443 B2 * 10/2005 Ruffieux .................... 331/158

FOREIGN PATENT DOCUMENTS

DE    198 35 198    2/2000

* cited by examiner

*Primary Examiner*—Robert Pascal
*Assistant Examiner*—James E Goodley
(74) *Attorney, Agent, or Firm*—Dicke, Billig, Czaja PLLC

(57) ABSTRACT

An oscillator arrangement having a resonator and a drive circuit which is connected to a connecting terminal of the oscillator is disclosed. In one embodiment, the oscillator includes
  a current source circuit is connected between a terminal for a first supply potential and the connecting terminal of the resonator and supplies the connecting terminal with a current source current which varies periodically at an oscillator frequency.

A current sink circuit is connected between the connecting terminal of the resonator and a second supply potential, where the current sink circuit draws a current sink current from the connecting terminal, said current sink current varying periodically at the oscillator frequency and being negatively fed back to the current source current.

24 Claims, 4 Drawing Sheets

OSCILLATOR ARRANGEMENT HAVING INCREASED EMI ROBUSTNESS

CROSS-REFERENCE TO RELATED APPLICATIONS

This Utility Patent Application claims priority to German Patent Application No. DE 103 45 234.6-35, filed on Sep. 29, 2004, which is incorporated herein by reference.

FIELD OF THE INVENTION

The present invention relates to an oscillator arrangement.

BACKGROUND

Oscillator circuits—whose basic principle is based on the oscillator circuit described in Tietze, Schenk: "Halbleiter-Schaltungstechnik" [Semiconductor Circuitry], 11th edition, Springer Verlag, page 914, FIG. 14.19—are known generally. Such a known arrangement will first of all be explained with reference to FIG. 1 in order to assist understanding of the invention explained below. The oscillator circuit includes a resonator Q1, particularly a crystal resonator, which is connected between a terminal K1 and a connection for a negative supply potential VSS or reference-ground potential. A variable capacitor Cs is connected in series with the resonator Q1 for the purpose of setting or trimming the resonant frequency.

A drive circuit having a current source circuit 10 with positive feedback is provided for the purpose of exciting the resonator, the current source circuit 10 being connected between a positive supply potential VDD and the terminal K1. In addition, the drive circuit comprises a current sink Iq1 which is connected between the terminal K1 and the negative supply potential VSS and is used to set a basic current that is supplied by the current source circuit 10.

The current source circuit 10 includes a first transistor M1 which, in the example, is in the form of an NMOS transistor and whose load path is connected in series with a first resistor R1 between the positive supply potential VDD and the first terminal K1, a capacitor C1 being in parallel with the first resistor R1. This first transistor M1 is operated with positive feedback to a current Iosc flowing into or out of the resonator Q1, as will be explained below. Provided for this purpose is a second transistor M2 which, in the example, is likewise in the form of an NMOS transistor whose control connection is connected to a node that is common to the load path of the first transistor M1 and the first resistor R1. The load path of this second transistor M2 is connected in series with a second resistor R2 and is connected to the positive supply potential VDD via this second resistor R2. A second capacitor C2 is in parallel with this second resistor R2, the drive connection of the first transistor M1 being connected to a node that is common to the load path of the second transistor M2, the second capacitance C2 and the second resistor R2.

The second transistor M2 is part of an amplifier circuit which is in the form of a differential amplifier and, in addition to the second transistor M2, comprises a third transistor M3 whose load path is connected in series with a third resistor R3 in parallel with the series circuit including the second transistor M2 and the second resistor R2. A node that is common to the load paths of the second and third transistors M2, M3 is connected, via a second current source Iq2, to the negative supply potential VSS. For the purpose of setting the operating point of the differential amplifier and the third transistor M3, a fourth resistor is connected between the positive supply potential VDD and the drive connection of said third transistor, and a third current source Iq3 is connected between the drive connection of said third transistor and the negative supply potential VSS.

In the steady state, the resonator Q1 draws a periodic current Iosc whose frequency corresponds to the resonator's resonant frequency and whose DC component is zero.

In the circuit arrangement having the current source 10, the differential amplifier M2, M3 and the setting circuit R4, Iq3, the latter are matched to one another in this case in such a manner that, in the case of an oscillator current Iosc=0, the drive potentials P2, P3 for the second and third transistors M2, M3 are identical when the current I1 flows through the first transistor M. This matching is effected by dimensioning the first and fourth resistors. The second and third resistors are usually the same size.

The way in which the invention described works is explained below.

To this end, the case in which the oscillator current Iosc is equal to zero will be considered first of all. In that case, the current I1 supplied by the current source flows through the first resistor R1, said current giving rise to a voltage drop $$U1 = I1 \cdot R1 \tag{1}$$

across this resistor. The drive potential P2 on the drive connection of the second transistor M2 is then $$P2 = VDD - U1 = VDD - I1 \cdot R1 \tag{2}$$

A current I21 which gives rise to a voltage drop U2 across the second resistor R2 flows through the second transistor M2, said voltage drop determining the drive potential P1 for the first transistor M1, for which $$P1 = VDD - U2 \tag{3}$$

If a current Iosc now flows, in the direction indicated, from the terminal K1 into the resonator Q1, the current flowing through the first transistor M1 rises by this current drawn by the resonator Q1. As a result, the voltage drop U1 across the first resistor R1 rises, and the drive potential P2 for the second transistor M2 falls. This limits the second transistor M2, as a result of which the current flowing through the resistor R2 falls and the voltage drop U2 across this resistor R2 decreases. This increases the drive potential P1 for the first transistor M1, as a result of which the transistor M1 is turned on in order to increase the current flowing into the resonator Q1.

If, by contrast, a current flows from the resonator Q1 into the terminal K1, the current flowing through the first transistor M1 is reduced by the current Iosc provided by the resonator Q1. As a result, the voltage drop U1 across the first resistor R1 falls, and the drive potential P2 for the second transistor M2 rises. This turns on the second transistor M2, as a result of which the current flowing through the resistor R2 rises, and the voltage drop U2 across this resistor R2 increases. As a result, the drive potential P1 for the first transistor M1 falls, as a result of which this first transistor M1 is limited to the previous operating point in order to increase the current flowing from the resonator Q1 into the terminal K1.

In summary, the current source arrangement 10 is thus operated with positive feedback to the current which is drawn by the resonator and varies periodically at the resonant frequency.

The capacitors C1, C2 which are connected in parallel with the first and second resistors R1, R2 are dimensioned in such a manner that the oscillator is stimulated to oscillate at its fundamental frequency but not at harmonics of the resonant frequency. Changes in the currents flowing through the first and second transistors M1, M2, at a frequency above the resonant frequency, are filtered out by these capacitors C1, C2 and can thus change the respective drive potentials P1, P2 for the transistors M1, M2 to a lesser extent.

The following is true for an input impedance Zin1 of the drive circuit at the terminal K1:

$$Zin = 1/gm1 - Z1 \cdot Z2 \cdot gm2/2 \qquad (4),$$

where gm1 denotes the transconductance, i.e., the ratio of the output current to the applied voltage, of the first transistor M1 at the operating point at which the transistor is operated. gm2 accordingly denotes the transconductance of the second transistor. Z1 denotes the impedance of the parallel circuit including the first resistor R1 and the first capacitor, and Z2 denotes the impedance of the parallel circuit including the second resistor R2 and the second capacitor C2. Referring to the equivalent circuit diagram which is likewise illustrated in FIG. 1, this input impedance is illustrated as a series circuit including a negative resistance and an inductance.

Interference may occur in such an oscillator arrangement when radio-frequency noise signals (EMI signals) are injected into the circuit at the terminal K1 and are superimposed on the oscillator current Iosc.

In order to increase the robustness of such an oscillator arrangement with respect to radio-frequency noise signals, it is possible to increase the basic current I1 of the first current source Iq1. However, such a procedure is not suitable for oscillator arrangements which are used in systems that have been optimized for a low power consumption.

SUMMARY

The present invention provides an oscillator arrangement having increased robustness with respect to radio-frequency noise signals.

This aim is achieved by means of an oscillator arrangement in accordance with the features of claim 1. The subclaims relate to advantageous refinements of the invention.

The oscillator arrangement comprises a resonator, preferably a crystal resonator having a connecting terminal, and a drive circuit for the resonator, said drive circuit being connected to the connecting terminal. The drive circuit comprises a current source circuit, which is connected between a terminal for a first supply potential and the connecting terminal of the resonator and supplies the connecting terminal with a current source current which varies periodically at the oscillator frequency, and a current sink circuit which is connected between the connecting terminal of the resonator and a second supply potential. The current sink circuit is designed to draw a current sink current from the connecting terminal, said current sink current varying periodically at the oscillator frequency and being negatively fed back to the current source current.

In comparison with conventional drive circuits having a static current sink, this drive circuit having the current source circuit (which is operated with positive feedback to the oscillator current) and the current sink circuit (which is operated with negative feedback to the current source circuit) produces an increased oscillator current. This is because, if the resonator in this arrangement draws current, the current drawn by the current sink is reduced, as a result of which a higher current than in conventional drive circuits flows from the current source to the resonator. If current flows from the resonator into the drive circuit, the current drawn by the current sink increases, as a result of which a higher current than in conventional drive circuits flows from the resonator into the drive circuit. In summary, the increased oscillator current results in a higher signal-to-noise ratio and thus increased robustness with respect to noise signals.

One embodiment provides for the current source circuit to have a first transistor whose load path is connected in series with a first load between the terminal for the first supply potential and the oscillator terminal K1. This first transistor is cross-coupled to a second transistor whose load path is connected in series with a second load to the terminal for the first supply potential and which is driven on the basis of a flow of current through the first load. In this case, the first transistor is driven on the basis of a flow of current through the second load.

The current sink circuit has a transistor whose load path is connected between the terminal K1 and the second supply potential and whose drive connection is coupled to the drive connection of the second transistor in order to be operated in synchronism with the second transistor and thereby in a push-pull manner with respect to, or with negative feedback to, the first transistor in the current source circuit.

The drive connection of the transistor in the current sink circuit is preferably coupled capacitively to the drive connection of the second transistor by means of a capacitor connected between the drive connections.

In one embodiment, the second transistor is part of a differential amplifier having a third transistor whose load path is connected in series with a third load to the first supply potential, a load connection of the second transistor and a load connection of the third transistor being jointly connected to the second supply potential via a current source. For the purpose of setting an operating point for the current sink transistor, this embodiment provides an amplifier, one input of which is preferably connected to the drive connection of the second transistor via a low-pass filter, the other input of which is connected to the drive connection of the third transistor, and the output of which is connected to the drive connection of the current sink transistor.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 2:
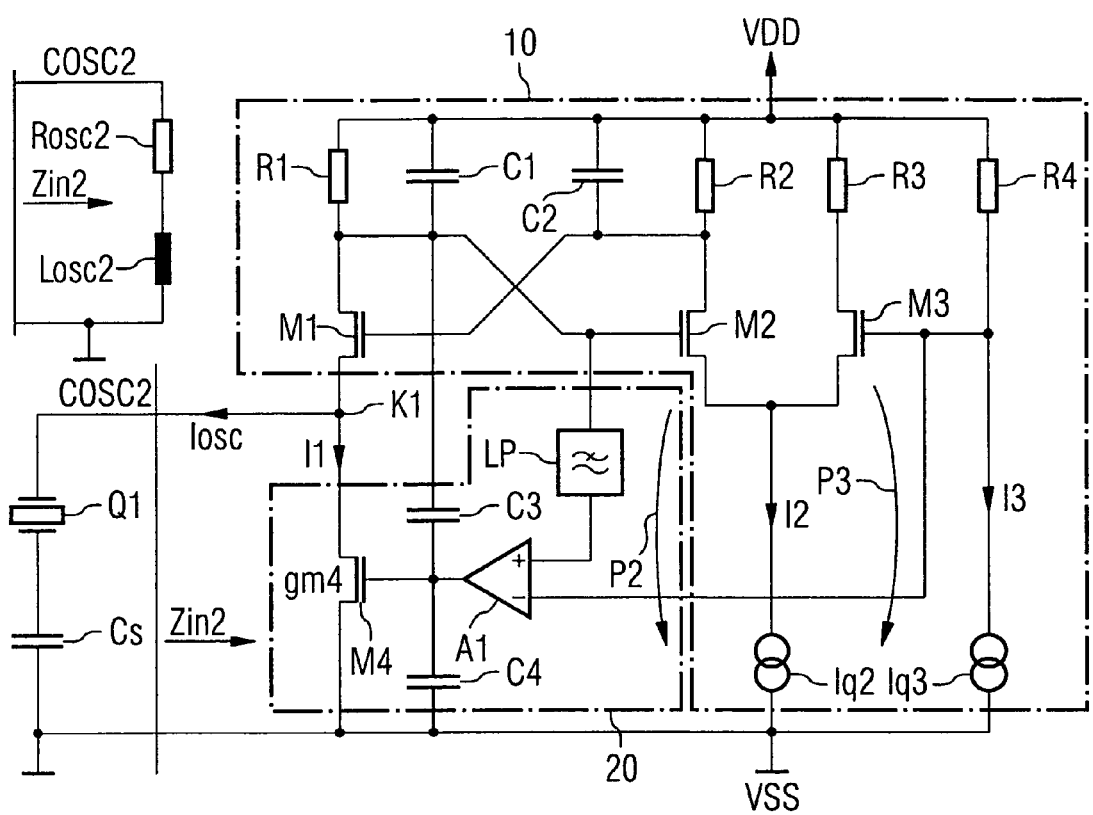
FIG. 2 illustrates an exemplary embodiment of an inventive oscillator arrangement having a resonator and a drive circuit for the resonator.

The oscillator arrangement illustrated in FIG. 2 comprises a resonator Q1, preferably a crystal resonator Q1, which is connected between a connecting terminal K1 and a second supply potential VSS or reference-ground potential. In the exemplary embodiment, a capacitor Cs which is used to trim the resonant frequency of the resonator Q1 and is preferably variable is in series with this resonator Q1. A drive circuit for the oscillator comprises a current source circuit 10 which is connected between a terminal for a first supply potential or positive supply potential VDD and the oscillator connecting terminal K1. The drive circuit furthermore comprises a current sink circuit 20 which is connected between the oscillator connecting terminal K1 and the second supply potential VSS.

The current source circuit 10 shown in the example corresponds, in terms of its design, to the current source circuit 10 explained with reference to FIG. 1 and, in the steady state of the oscillator arrangement, is designed to supply the oscillator terminal K1 with a current which varies periodically at the oscillator frequency. To this end, the drive circuit 10 comprises a transistor M1 which is connected in series with a load R1, C1 between the first supply potential VDD and the oscillator connecting terminal K1, is turned on to an operating point (that is set at Iosc=0) during positive half-cycles of the oscillator current Iosc—when the current is thus flowing in the direction indicated in FIG. 2, and which, during negative half-cycles of the oscillator current Iosc, is limited to the operating point that is set. In order to drive the first transistor M1 with positive feedback to the oscillator current Iosc, a second transistor M2—whose load path is connected in series with a load R2, C2 between the terminal for the positive supply potential VDD and a current source Iq2—is provided. The load which is connected in series with the first transistor M1 comprises a parallel circuit comprising a first resistor R1 and a first capacitor C1. The load which is connected in series with the load path of the second transistor M2 comprises the parallel circuit comprising a second resistor R2 and a second capacitor C2.

The second transistor M2 is part of a differential amplifier comprising a third transistor M3 which is connected in series with a third resistor R3 between the positive supply potential VDD and the current source Iq2 that is likewise part of the differential amplifier. The first and second resistors R2, R3 are the same size. In order to set the operating point of this differential amplifier, the control connection of the third transistor M3 is connected, via a resistor R4, to the positive supply potential VDD and, via a current source Iq3, to the negative supply potential VSS.

The control connection of the second transistor M2 is connected to a node which is common to the load path of the first transistor M1 and the load R1, C1, and the control connection of the first transistor M1 is connected to a node which is common to the load path of the second transistor M2 and the second load R2, C2.

The current sink circuit 20 comprises a fourth transistor M4 whose load path is connected between the oscillator terminal K1 and the negative supply potential VSS. This fourth transistor GM4 is operated with negative feedback to the first transistor M1 in the current source circuit 10 and, in the exemplary embodiment, is coupled, for this purpose, to the control connection of the second transistor M2 which, as has already been explained, is likewise operated with negative feedback to the first transistor M1 in order to operate the first transistor M1 with positive feedback to the oscillator current Iosc. The control connection of the fourth transistor M4 and the control connection of the second transistor M2 are capacitively coupled by means of a capacitive voltage divider having a first capacitor C3 and a second capacitor C4, said voltage divider being connected between the control connection of the second transistor M2 and the negative supply potential VSS, and the control connection of the fourth transistor M4 being connected to the center tap of said voltage divider. In this case, the fourth capacitor C4 is preferably formed by the gate-source capacitance (inevitably present) of the fourth transistor M4 which, in the example, is in the form of an NMOS transistor. At the customary oscillator frequencies and with the turning-on and limiting operations—that take place at the same frequency—of the transistors M1, M2, the capacitive coupling explained causes the fourth transistor M4 to be operated in synchronism with the second transistor M2.

The way in which this circuit arrangement works is explained below.

In the case of an oscillator current Iosc=0, the transistors M1-M4 in the drive circuit are at their respective operating point, on the basis of which they are turned on or limited during positive or negative half-cycles of the oscillator current Iosc. In order to set the operating point of the fourth transistor M4 in the current sink circuit 20, there is a transconductance amplifier A1 whose inputs are connected to the inputs of the differential amplifier in the current source circuit 10, one of the inputs being connected to the drive connection of the second transistor M2 via a low-pass filter LP. This transconductance amplifier A1 sets the operating point of the fourth transistor M4 in such a manner that, in the case of an oscillator current Iosc=0, the first transistor M1 has a current flowing through it which causes the drive potential P2 (which is dependent on this flow of current) for the second transistor M2 to correspond to the drive potential P3 for the third transistor M3. In this case, the output impedance of this transconductance amplifier A1 is of such a magnitude that drive signals which are injected into the drive connection of the fourth transistor M4 by the drive connection of the second transistor M2 via the capacitive voltage divider are not distorted or corrupted.

During a positive half-cycle of the oscillator current Iosc, the first transistor M1 is turned on to its operating point in the manner explained, while the second transistor M2, and thus also the fourth transistor M4 that is coupled to this second transistor M2, are limited to the respective operating point when Iosc=0. This reduces the current flowing through the fourth transistor M4, thus resulting in an increased oscillator current Iosc, since the current supplied by the current source circuit 10 is not influenced by the limitation of the fourth transistor M4.

It should be assumed that, when Iosc=0, a current I1 flows through the first and fourth transistors M1, M4. If, during a positive half-cycle of the oscillator current Iosc, the first transistor M1 is turned on in such a manner that a current I1+ΔI1 flows through the latter and a current I1−ΔI1 flows through the fourth transistor M4 on account of its limitation, this results in an oscillator current Iosc=2·ΔI1. Under the same conditions, only an oscillator current Iosc=ΔI1 would be drawn by the resonator in the oscillator circuit based on the prior art (shown in FIG. 1) having a static current sink. The inventive drive circuit thus considerably increases the oscillator current Iosc for unchanged power consumption. This increase in the oscillator current Iosc results in an increased signal-to-noise ratio and the latter results in increased robustness with respect to radio-frequency noise signals.

For the sake of completeness, it should be mentioned that, during the negative half-cycle of the oscillator current Iosc, the first transistor M1 is limited in the manner explained above, and the fourth transistor M4, which is operated with negative feedback, is turned on. As a result, the fourth transistor M4 accepts a higher current than in the state when Iosc=0, thus resulting in an increased oscillator current Iosc in comparison with the prior art.

In summary, providing a current sink circuit which is operated with negative feedback to the current source circuit makes it possible, for the same power consumption of the drive circuit, to considerably increase the oscillator current and thus to considerably improve the robustness with respect to radio-frequency noise signals.

The following is true for the input impedance Zin of the drive circuit illustrated in FIG. 2:

In this case, Z1 is the impedance of the first load, that is to say of the parallel circuit comprising the first resistor R1 and the first capacitor C1, Z2 is the impedance of the second load, gm4 is the transconductance of the fourth transistor M4 at its operating point when Iosc=0, and k=C3/(C3+C4) is the capacitive voltage divider ratio of the voltage divider formed from the capacitors C3, C4. The capacitance value of the first capacitor C1, which is in series with this capacitive voltage divider, is preferably considerably smaller than the capacitance value of the capacitor C3 which couples the fourth transistor M4 to the second transistor M2.

Figure 1:
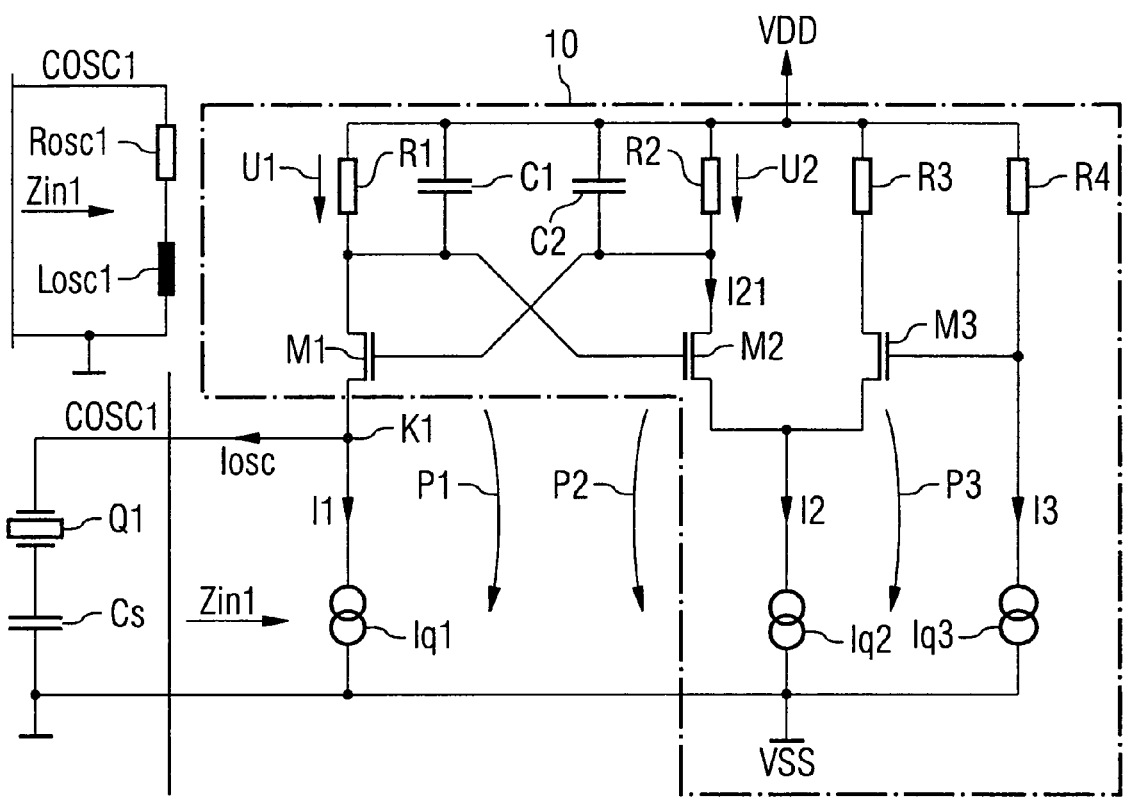
FIG. 1 illustrates an oscillator arrangement (based on the prior art) having a resonator and a drive circuit for the resonator.
Figure 3:
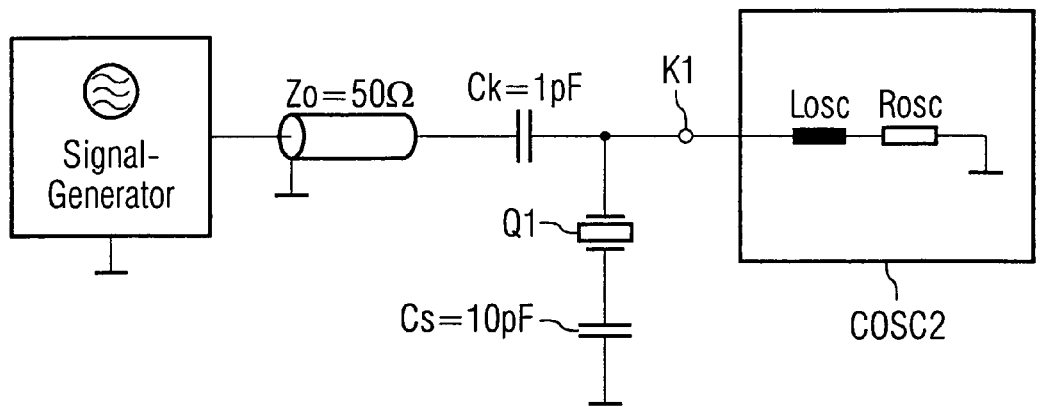
FIG. 3 illustrates a test arrangement for ascertaining the influence of noise signals on the inventive oscillator arrangement.

The considerable improvement in the robustness—with respect to noise signals—of the drive circuit illustrated in FIG. 2 in comparison with the known drive circuit shown in FIG. 1 was verified using an experiment, the test set-up of which is shown in FIG. 3.

In this case, the drive circuit is shown in the form of the small-signal equivalent circuit diagram which comprises a series circuit comprising the negative resistance Rosc2 determined in the above equation and the inductance Losc2.

A radio-frequency signal was injected into the oscillator terminal K1 via a capacitor having a capacitance of 1 pF. This signal was provided by a signal generator having an output impedance of 50 ohms, the power of this radio-frequency signal having been increased until the oscillator arrangement no longer operated at the desired frequency.

Figure 4:
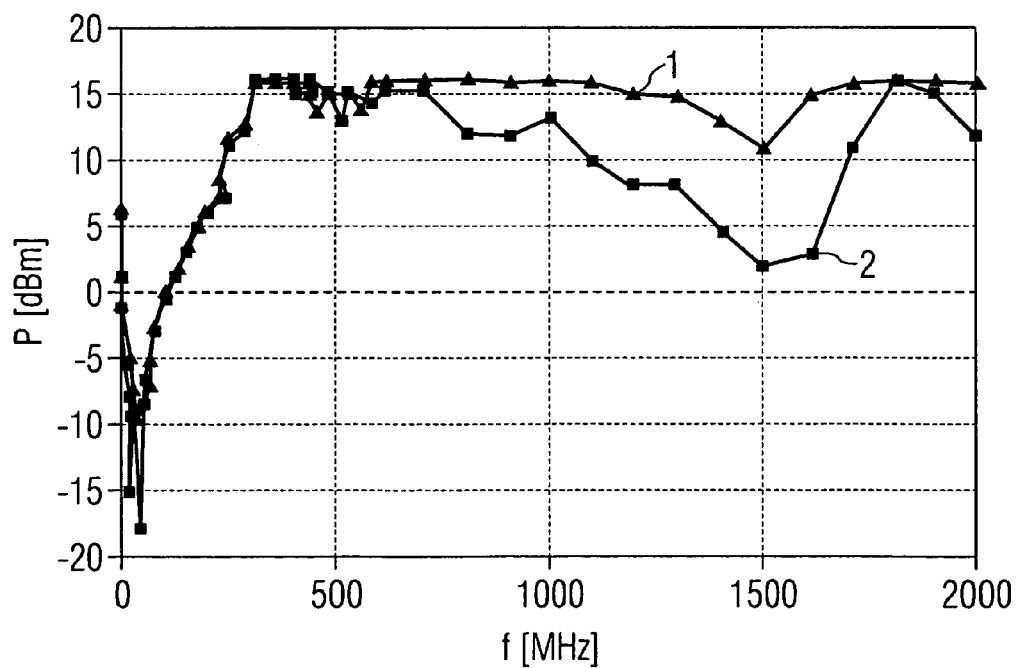
FIG. 4 illustrates the maximum power of noise signals (which are coupled to the oscillator terminal in the arrangement illustrated in FIG. 3) tolerated by the oscillator arrangement plotted against the frequency.

Curve 2 in FIG. 4 illustrates these maximum tolerated noise signal power levels plotted against the frequency for the oscillator arrangement based on the prior art and curve 1 shows them for the inventive oscillator arrangement. This clearly shows that, particularly for noise signals in a range between 0.5 and 2 GHz, the inventive oscillator arrangement tolerates considerably higher noise signal power levels than an oscillator arrangement based on the prior art.

Figure 5A:
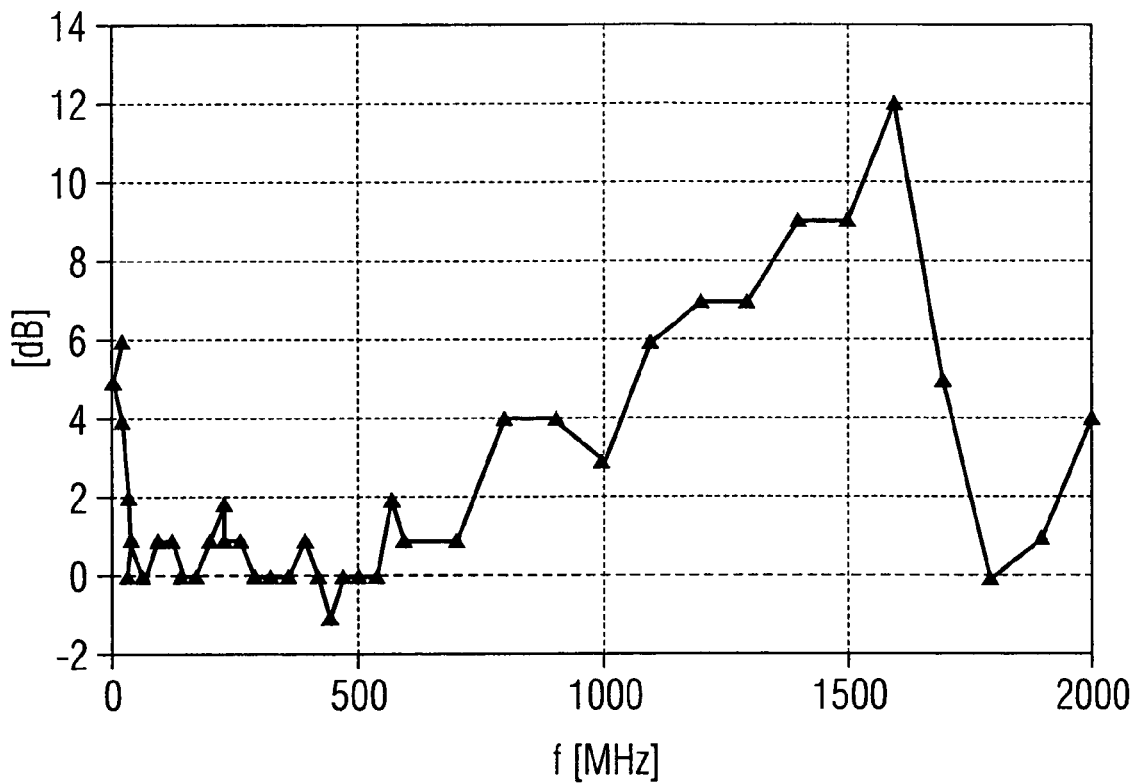
FIG. 5 illustrates improvements in the robustness of the inventive oscillator arrangement in comparison with a known oscillator arrangement.

FIG. 5a illustrates the difference between curve 2 and curve 1, that is to say the difference between the noise signal power levels tolerated by the inventive oscillator arrangement and those tolerated by the oscillator arrangement based on the prior art, for the respective frequency.

Figure 5B:
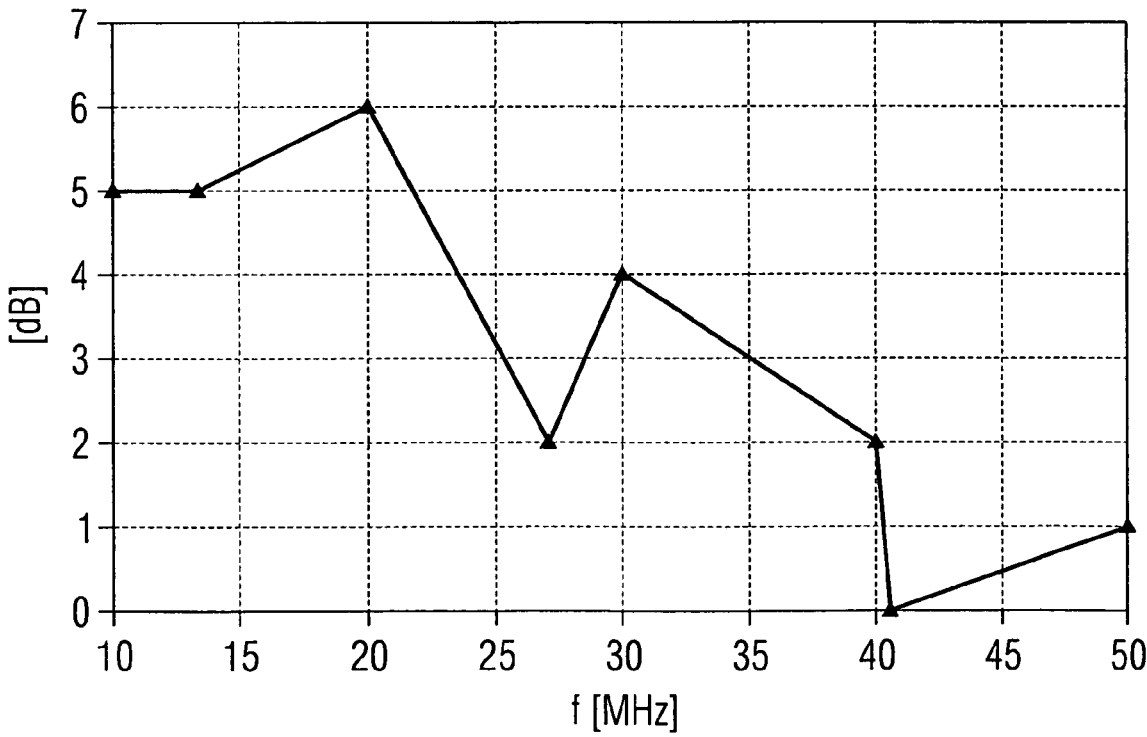

FIG. 5b illustrates part of the curve in FIG. 5a for the frequency range between 10 and 50 MHz.

The invention claimed is:

1. An oscillator arrangement comprising:
an oscillator terminal;
a resonator coupled to the oscillator terminal; and
a drive circuit coupled to the oscillator terminal, the drive circuit comprising:
a current source circuit connected between a terminal for a first supply potential and the oscillator terminal and configured to supply the oscillator terminal with a current source current which varies periodically at an oscillator frequency and including cross-coupled first and second transistors configured to provide positive feedback in the current source circuit; and
a current sink circuit connected between the oscillator terminal and a second supply potential and configured to draw a current sink current from the oscillator terminal, the current sink current varying periodically at the oscillator frequency, wherein the current sink circuit receives differential feedback signals via the current source circuit to provide negative feedback of the current sink current to the current source current such that the current sink current varies inversely to the current source current, wherein one branch of each of the differential feedback signals are low-pass filtered versions of the current source current.

2. The oscillator arrangement as claimed in claim 1, wherein the current sink circuit is coupled to the current source circuit.

3. The oscillator arrangement as claimed in claim 2, wherein the current source circuit comprises:
a first transistor whose load path is connected in series with a first load between the terminal for the first supply potential and the oscillator terminal;
a second transistor whose load path is connected in series with a second load to the terminal for the first supply potential and which is driven on the basis of a flow of current through the first load; and
wherein the first transistor is driven on the basis of a flow of current through the second load.

4. The oscillator arrangement as claimed in claim 1, wherein the current source comprises:
a first transistor whose load path is connected in series with a first load between the terminal for the first supply potential and the oscillator terminal;
a second transistor whose load path is connected in series with a second load to the terminal for the first supply potential and which is driven on the basis of a flow of current through the first load; and
wherein the first transistor is driven on the basis of a flow of current through the second load.

5. The oscillator arrangement as claimed in claim 4, wherein the current sink circuit includes a transistor whose load path is connected between the oscillator terminal and the second supply potential and whose drive connection is coupled to the drive connection of the second transistor.

6. The oscillator arrangement as claimed in claim 3, wherein a drive connection of the second transistor is connected to a node that is common to the load path of the first transistor and the first load, and in which a drive connection of the first transistor is connected to a node that is common to the load path of the second transistor and the second load.

7. The oscillator arrangement as claimed in claim 6, wherein the current sink circuit has a transistor whose load path is connected between the oscillator terminal and the second supply potential and whose drive connection is coupled to the drive connection of the second transistor.

8. The oscillator arrangement as claimed in claim 7, wherein the drive connection of the second transistor is coupled capacitively to the drive connection of the transistor in the current sink circuit.

9. The oscillator arrangement as claimed in claim 8, wherein the second transistor is part of a differential amplifier having a third transistor whose load path is connected in series with a third load to the first supply potential, a load connection of the second transistor and a load connection of the third transistor being jointly connected to the second supply potential via a current source.

10. The oscillator arrangement of claim 8, comprising an amplifier configured for setting the operating point of the transistor in the current sink circuit, having one input of which is connected to the drive connection of the second transistor and the other input of which is connected to the drive connection of the third transistor.

11. An oscillator arrangement comprising:
a resonator and a drive circuit connected to a connecting terminal of an oscillator, the drive circuit comprising:
a current source circuit connected between a terminal for a first supply potential and the connecting terminal of the oscillator and configured to supply the connecting terminal with a current source current which varies periodically at an oscillator frequency; and
a current sink circuit which is connected between the connecting terminal of the oscillator and a second supply potential and configured to draw a current sink current from the connecting terminal, the current sink current varying periodically at the oscillator frequency, wherein the current sink receives differential feedback signals via the current source circuit to provide negative feedback of the current sink current to the current source current such that the current sink current varies inversely to the current source current, wherein the current source circuit includes cross-coupled first and second transistors configured to provide positive feedback in the current source circuit and a differential amplifier including the second transistor and a third transistor whose load path is connected in series with a load to the first supply potential, a load connection of the second transistor and a load connection of the third transistor being jointly connected to the second supply potential via a current source, and wherein one branch of each of the differential feedback signals are low-pass filtered versions of the current source current.

12. The oscillator arrangement as claimed in claim 11, wherein the current sink circuit is coupled to the current source circuit.

13. The oscillator arrangement as claimed in claim 12, wherein:
the first transistor includes a load path connected in series with a first load between the terminal for the first supply potential and the oscillator terminal;
the second transistor includes a load path connected in series with a second load to the terminal for the first supply potential and which is driven on the basis of a flow of current through the first load; and
the first transistor is driven on the basis of a flow of current through the second load.

14. The oscillator arrangement as claimed in claim 13, wherein a drive connection of the second transistor is connected to a node that is common to the load path of the first transistor and the first load, and in which a drive connection of the first transistor is connected to a node that is common to the load path of the second transistor and the second load.

15. The oscillator arrangement as claimed in claim 14, wherein the current sink circuit has a transistor whose load path is connected between the oscillator terminal and the second supply potential and whose drive connection is coupled to the drive connection of the second transistor.

16. The oscillator arrangement as claimed in claim 15, wherein the drive connection of the second transistor is coupled capacitively to the drive connection of the transistor in the current sink circuit.

17. The oscillator arrangement as claimed in claim 11, wherein the current sink circuit receives differential feedback signals and provides negative feedback in the current sink current, wherein the differential feedback signals are received via a drive connection of the second transistor and a drive connection of the third transistor.

18. An oscillator arrangement having a resonator and a drive circuit which is connected to a connecting terminal of the oscillator comprising:
a current source circuit which is connected between a terminal for a first supply potential and the connecting terminal of the oscillator and configured to supply the connecting terminal with a current source current which varies periodically at an oscillator frequency, the current source circuit including cross-coupled first and second transistors configured to provide positive feedback in the current source circuit and a differential amplifier including the second transistor and a third transistor;
a current sink circuit which is connected between the connecting terminal of the oscillator and a second supply potential and configured to draw a current sink current from the connecting terminal, said current sink current varying periodically at the oscillator frequency, the current sink circuit including:
a current sink transistor; and
an amplifier configured for setting the operating point of the current sink transistor in the current sink circuit, wherein the amplifier is configured to receive differential feedback signals via one input connected to the second transistor and the other input connected to the third transistor and to provide negative feedback of the current sink current to the current source current via the current sink transistor, and wherein one branch of each of the differential feedback signals are low-pass filtered versions of the current source current.

19. An oscillator arrangement comprising:
a resonator coupled to a connecting terminal of an oscillator;
means for providing a current source current that varies periodically at an oscillator frequency between a terminal for a first supply potential and the connecting terminal of the oscillator, including cross-coupled first and second transistors to provide a positive feedback means;
means for providing a current sink current that varies periodically at an oscillator frequency between the connecting terminal of the oscillator and a second supply potential and from the connecting terminal;
means for providing differential feedback signals from the means for providing a current source current, and wherein one branch of each of the differential feedback signals are low-pass filtered versions of the current source current; and
means for providing negative feedback of the current sink current to the means for providing a current source current based on the differential feedback signals such that the current sink current varies inversely to the current source current.

20. The oscillator arrangement as claimed in claim 19, wherein the means for providing a current sink current is coupled to the means for providing a current source current, and wherein the means for providing a current source current comprises:
a first transistor whose load path is connected in series with a first load between the terminal for the first supply potential and the oscillator terminal;
a second transistor whose load path is connected in series with a second load to the terminal for the first supply potential and which is driven on the basis of a flow of current through the first load; and
wherein the first transistor is driven on the basis of a flow of current through the second load.

21. An oscillator drive circuit comprising:
a current sink circuit connected between a first supply potential and a connecting terminal of the drive circuit and configured to draw a current sink current that varies periodically at an oscillator frequency from the connecting terminal; and
a current source circuit connected between a second supply potential and the connecting terminal and configured to supply a current source current that varies periodically at an oscillator frequency to the connecting terminal, wherein the current source circuit includes cross-coupled transistors that provide positive feedback in the current source circuit, and wherein the current sink circuit receives differential feedback signals via the current source circuit to provide negative feedback of the current sink current to the current source circuit such that the current sink current varies inversely to the current source current, and wherein one branch of each of the differential feedback signals are low-pass filtered versions of the current source current.

22. The oscillator drive circuit of claim 21, wherein the current sink circuit receives differential feedback signals via the current source circuit to provide negative feedback in the current sink current and to the current source circuit.

23. The oscillator drive circuit of claim 22, wherein the current sink circuit receives at least one of the differential feedback signals from a drive connection of one of the cross coupled transistors.

24. A method of driving an oscillator comprising:
coupling a resonator to a connecting terminal;
supplying a current source current that varies periodically at an oscillator frequency to the connecting terminal and includes cross-coupled first and second transistors to provide positive feedback in the current source circuit;
drawing a current sink current that varies periodically at an oscillator frequency from the connecting terminal;
providing differential feedback signals associated with supplying the current source current, wherein one branch of each of the differential feedback signals are low-pass filtered versions of the current source current; and
providing negative feedback of the current sink current to the current source current based on the differential feedback signals such that the current sink current varies inversely to the current source current.

\* \* \* \* \*